United States Patent
Han et al.

(10) Patent No.: US 10,366,493 B2
(45) Date of Patent: Jul. 30, 2019

(54) DISPLAY DEVICE AND METHOD OF FABRICATING THE SAME

(71) Applicant: Samsung Display Co., Ltd., Yongin-si (KR)

(72) Inventors: Sangyoun Han, Seoul (KR); Jae-wook Kang, Hwaseong-si (KR); Kyungseop Kim, Hwaseong-si (KR); Jungha Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 15/481,746

(22) Filed: Apr. 7, 2017

(65) Prior Publication Data

US 2017/0345152 A1    Nov. 30, 2017

(30) Foreign Application Priority Data

May 27, 2016 (KR) .......................... 10-2016-0065903

(51) Int. Cl.
*G06T 7/11* (2017.01)
*G09G 3/32* (2016.01)
(Continued)

(52) U.S. Cl.
CPC .............. *G06T 7/11* (2017.01); *G06K 9/0002* (2013.01); *G09G 3/32* (2013.01); *H01L 27/02* (2013.01);
(Continued)

(58) Field of Classification Search
CPC .. G06T 7/11; G06K 9/00006; G06K 9/00013; G06K 9/0002; G06K 9/0004; G09G 3/32;
(Continued)

(56) References Cited

U.S. PATENT DOCUMENTS 4,788,593 A    11/1988 Ovshinsky et al.
5,146,102 A    9/1992 Higuchi et al.
(Continued)

FOREIGN PATENT DOCUMENTS

KR    10-2003-0058718    7/2003
KR       10-0705622    4/2007
KR    10-2016-0029698    3/2016

*Primary Examiner* — John R Lee
(74) *Attorney, Agent, or Firm* — H.C. Park & Associates, PLC

(57) ABSTRACT

A display device includes a display panel includes a substrate divided into a light-emitting region and a non-light-emitting region including a sensing area, a pixel disposed on the light-emitting region, and a pixel-defining layer disposed on the non-light-emitting region, and a sensing panel which is disposed on the display panel and includes a sensing transistor configured to sense light that is emitted from the pixel and reflected by an external object. The sensing transistor overlaps the sensing area in a first direction parallel to a thickness direction of the display panel, is spaced apart from the light-emitting region in a second direction perpendicular to the first direction, and generates a current by receiving the light. The generated current may be used to sense light which is emitted from the pixel and reflected by an external object, such as a fingerprint, to allow the display to act as a biometric sensor.

15 Claims, 11 Drawing Sheets

(51) Int. Cl.
  *H01L 27/144* (2006.01)
  *H01L 27/146* (2006.01)
  *H01L 27/15* (2006.01)
  *H01L 27/02* (2006.01)
  *G06K 9/00* (2006.01)

(52) U.S. Cl.
  CPC .......... *H01L 27/144* (2013.01); *H01L 27/146* (2013.01); *H01L 27/15* (2013.01)

(58) Field of Classification Search
  CPC ..... H01L 27/02; H01L 27/144; H01L 27/146; H01L 27/1443; H01L 27/1446; H01L 27/14601; H01L 27/14609; H01L 27/1461; H01L 27/14612; H01L 27/14625; H01L 27/14627; H01L 27/14634; H01L 27/3244; H01L 27/3251; H01L 27/3253
  See application file for complete search history.

(56) References Cited

U.S. PATENT DOCUMENTS

| | | | | |
|---|---|---|---|---|
| 8,570,302 B2* | 10/2013 | Saito | ..................... | G06F 3/0412 345/173 |
| 2005/0030264 A1* | 2/2005 | Tsuge | ................... | G09G 3/3233 345/76 |
| 2009/0002341 A1* | 1/2009 | Saito | ..................... | G06F 3/0412 345/175 |
| 2009/0146967 A1* | 6/2009 | Ino | ..................... | G02F 1/133526 345/173 |
| 2009/0146992 A1* | 6/2009 | Fukunaga | ........... | G02F 1/13338 345/214 |
| 2011/0102705 A1* | 5/2011 | Miyazaki | .............. | G06F 3/0421 349/61 |
| 2011/0234574 A1* | 9/2011 | Tanaka | ................. | G09G 3/2096 345/211 |
| 2011/0310072 A1* | 12/2011 | Oyobe | .................... | G06F 3/042 345/207 |
| 2012/0032926 A1* | 2/2012 | Douxchamps | ...... | G02F 1/13338 345/175 |
| 2012/0133618 A1* | 5/2012 | Usukura | ............. | G02F 1/13338 345/175 |
| 2012/0319978 A1* | 12/2012 | Takeuchi | ........... | G02F 1/13338 345/173 |
| 2015/0187261 A1* | 7/2015 | Kim | ......................... | G09G 3/3208 345/690 |
| 2015/0331529 A1* | 11/2015 | Lee | ......................... | G06F 3/044 345/174 |
| 2015/0346856 A1* | 12/2015 | Wassvik | .................. | G06F 3/042 345/175 |
| 2016/0079333 A1* | 3/2016 | Shishido | ............. | H01L 27/3218 257/72 |
| 2017/0345152 A1* | 11/2017 | Han | ...................... | H01L 27/146 |

* cited by examiner

DISPLAY DEVICE AND METHOD OF FABRICATING THE SAME

CROSS-REFERENCE TO RELATED APPLICATIONS

This application claims priority from and the benefit of Korean Patent Application No. 10-2016-0065903, filed on May 27, 2016, which is hereby incorporated by reference for all purposes as if fully set forth herein.

BACKGROUND

Field

Exemplary embodiments relate to display devices and methods of fabricating the same. More particularly, exemplary embodiments relate to display devices having improved resolution and methods of fabricating the same which may be used as a biometric sensor.

Discussion of the Background

As the use of smartphones and tablets has increased, security of these devices has become more important. Authentication using biometric information, such as a fingerprint, iris, face, voice, and veins, has been used for device access and e-commerce, but the popular fingerprint authentication method has required a separate sensor.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a method of fabricating the same, and more particularly, a display device having improved resolution and a method of fabricating the same which may be used as a biometric sensor.

Additional aspects will be set forth in the detailed description which follows, and, in part, will be apparent from the disclosure, or may be learned by practice of the inventive concept.

An exemplary embodiment discloses a display device including: a display panel including a substrate, which is divided into a light-emitting region and a non-light-emitting region including a sensing area, a pixel disposed on the light-emitting region, and a pixel-defining layer disposed on the non-light-emitting region; and a sensing panel which is disposed on the display panel and includes a sensing transistor configured to sense light that is emitted from the pixel and reflected by an external object, wherein the sensing transistor overlaps the sensing area in a first direction parallel to a first direction of the display panel, is spaced apart from the light-emitting region in a second direction perpendicular to the first direction, and generates a current by receiving the light.

In an exemplary embodiment, the sensing panel may further include a cover window and a lens layer, the sensing transistor may include a photosensitive layer configured to sense the light, the cover window is divided into a light-transmitting area, which overlaps the photosensitive layer in the first direction and is disposed on the sensing area, and a light-absorbing area which is spaced apart from each of the photosensitive layer and the light-transmitting area in the second direction and disposed on the sensing area, and the lens layer overlaps the light-transmitting area in the first direction.

In an exemplary embodiment, the lens layer may be spaced apart from the light-absorbing area in the second direction and disposed between the cover window and the sensing transistor, wherein a bottom surface of the lens layer has a shape which is convex toward the sensing transistor.

In an exemplary embodiment, the sensing panel may further include a light-absorbing member disposed on a bottom surface of the light-absorbing area.

In an exemplary embodiment, the light-absorbing member may be spaced apart from the light-transmitting area in the second direction.

In an exemplary embodiment, the non-light-emitting region may further include a switching area, and the sensing panel may further include a switching transistor which overlaps the switching area in the first direction and is spaced apart from each of the light-emitting region and the sensing area in the second direction.

In an exemplary embodiment, the sensing panel may further include a transparent electrode which electrically connects a source electrode of the sensing transistor and a drain electrode of the switching transistor and overlaps the light-emitting region in the first direction.

In an exemplary embodiment, the sensing panel may further include a sensing processing unit, and the switching transistor may output a current generated from the sensing transistor to the sensing processing unit by switching.

Another exemplary embodiment discloses a method of fabricating a display device that includes providing a display panel including a substrate which is divided into a light-emitting region and a non-light-emitting region including a sensing area; forming a sensing panel; and disposing the sensing panel on the display panel, wherein the forming of the sensing panel includes: forming a cover window; and forming a sensing transistor on the cover window to overlap the sensing area in a first direction parallel to a thickness direction of the display panel and to be spaced apart from the light-emitting region in a second direction perpendicular to the first direction, and the disposing of the sensing panel includes disposing the sensing panel on the display panel to allow the sensing transistor to face a top of the display panel.

In an exemplary embodiment, the display panel may further include a pixel disposed on the light-emitting region and a pixel-defining layer disposed on the non-light-emitting region, the sensing transistor may include a photosensitive layer configured to sense light which is emitted from the pixel and reflected by an external object, the cover window is divided into a light-transmitting area, which overlaps the photosensitive layer in the first direction and is disposed on the sensing area, and a light-absorbing area which is spaced apart from each of the photosensitive layer and the light-transmitting area in the second direction and disposed on the sensing area, and the forming of the sensing panel further includes forming a lens layer to overlap the light-transmitting area in the first direction.

In an exemplary embodiment, the forming of the lens layer may include forming the lens layer to be spaced apart from the light-absorbing area in the second direction.

In an exemplary embodiment, the forming of the lens layer may include forming the lens layer to be disposed between the cover window and the sensing transistor and to allow a bottom surface thereof to be convex toward the sensing transistor.

In an exemplary embodiment, the forming of the sensing panel may further include forming a light-absorbing member on a bottom surface of the light-absorbing area.

In an exemplary embodiment, the forming of the light-absorbing member may include forming the light-absorbing member to be spaced apart from the light-transmitting area in the second direction.

In an exemplary embodiment, the method further may include forming a buffer member to allow one surface thereof to be attached to the sensing panel and another surface thereof to be attached to the display panel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
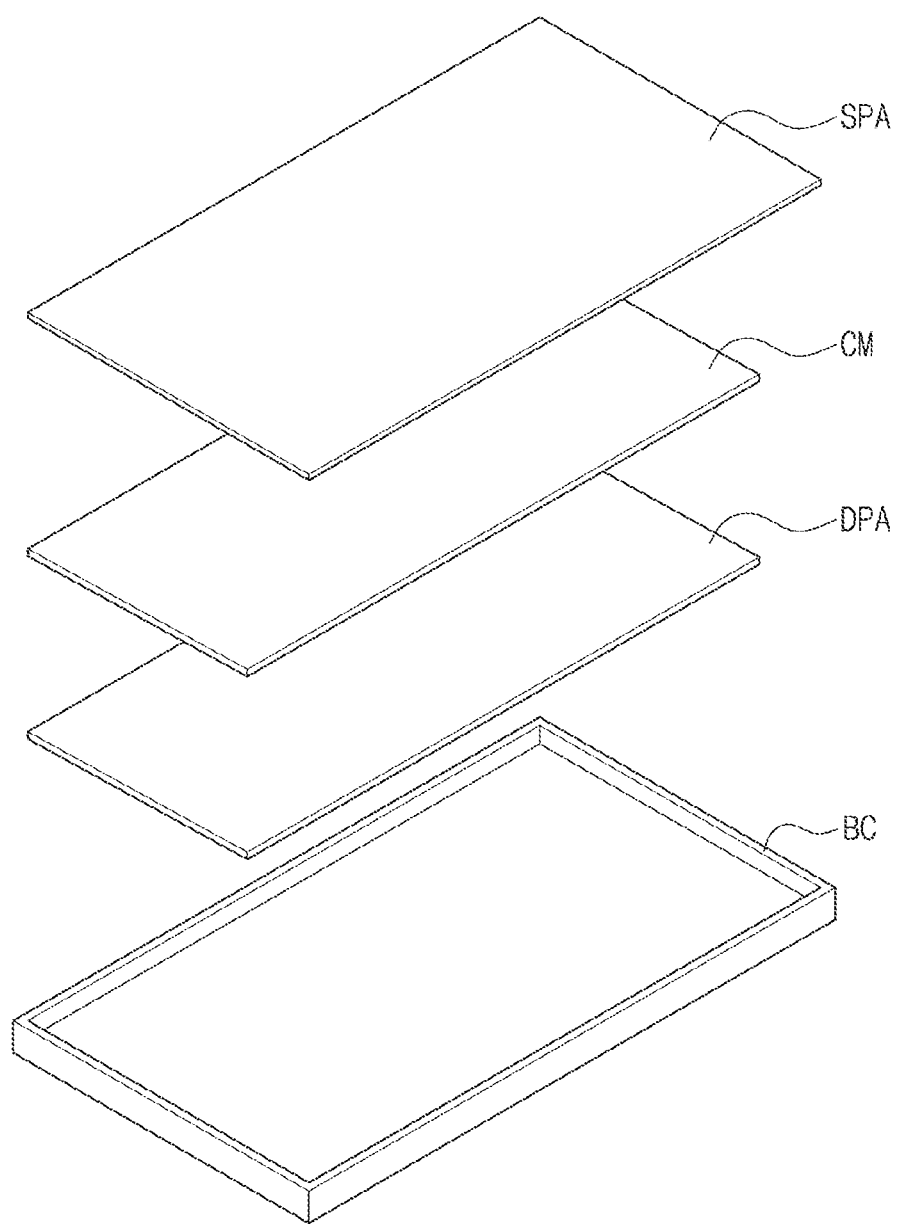
FIG. 1 is an exploded perspective view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not necessarily intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view illustrating a display device according to an exemplary embodiment.

Referring to FIG. 1, a display device 1000 according to an exemplary embodiment may include a display panel DPA, a buffer member CM, a sensing panel SPA, and a bottom chassis BC.

In an exemplary embodiment, the display panel DPA may have a plate shape. The display panel DPA may output an image in a thickness direction of the display panel by using applied power and image signal.

Hereinafter, the display panel DPA will be described as a display panel of an organic light-emitting display device. However, exemplary embodiments are not limited thereto, and, in an exemplary embodiment, the display panel DPA may also be another type of display device, such as a liquid crystal display device.

The buffer member CM may be disposed on a top of the display panel DPA. The buffer member CM may have a plate shape corresponding to the shape of the display panel DPA. The buffer member CM may absorb an external impact.

The sensing panel SPA may be disposed on a top of the buffer member CM. That is, one surface of the buffer member CM may be attached to the display panel DPA and another surface of the buffer member CM may be attached to the sensing panel SPA.

The sensing panel SPA may have a plate shape. The sensing panel SPA may generate a current by sensing external light. The sensing panel SPA will be described later in detail.

The bottom chassis BC may be disposed under the display panel DPA.

A space, in which the display panel DPA will be accommodated, may be defined in the bottom chassis BC.

Since the bottom chassis BC accommodates the display panel DPA, the bottom chassis BC may protect the display panel DPA by absorbing the external impact.

Figure 2:
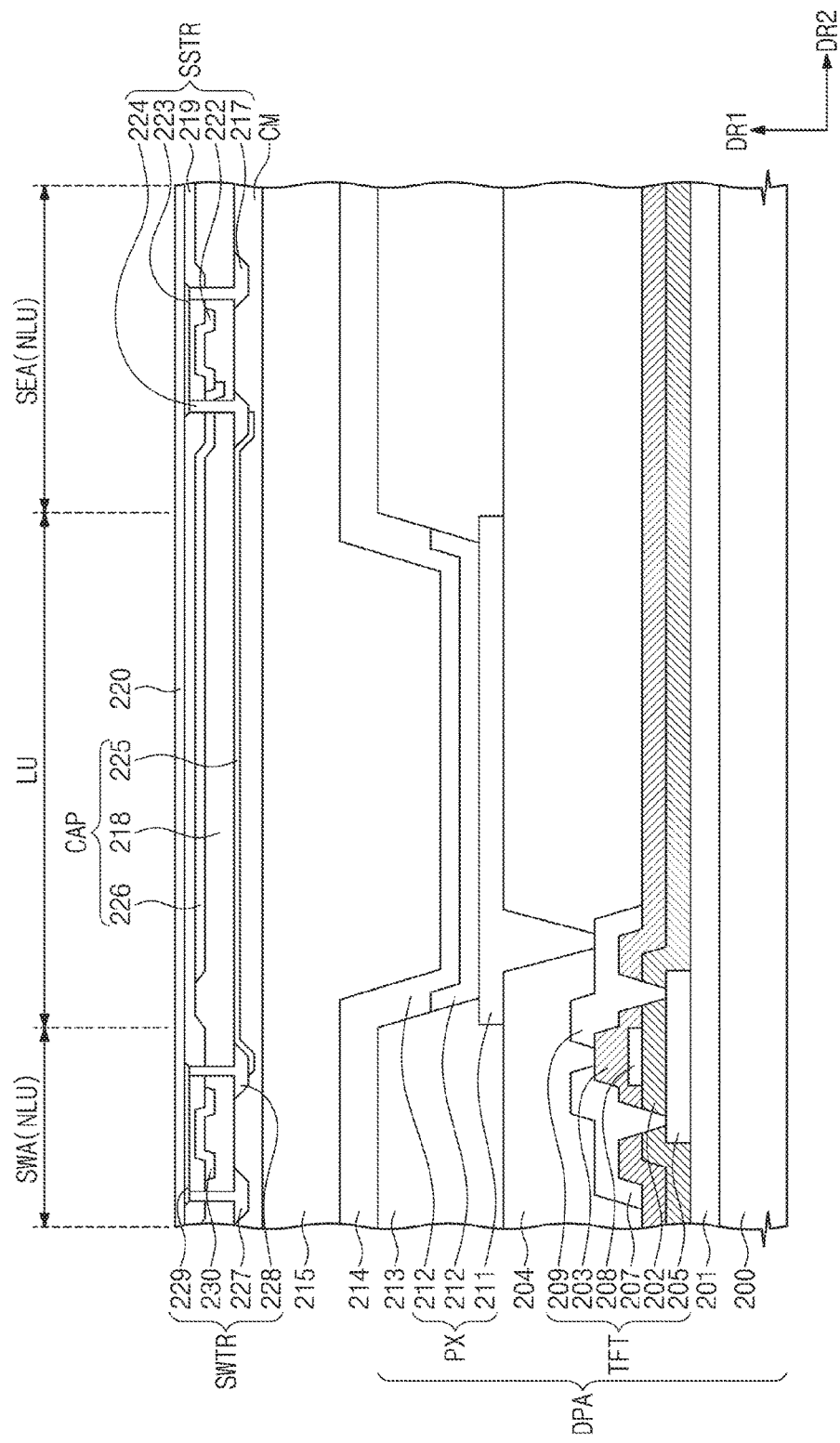
FIG. 2 illustrates a portion of a cross section of the display device according to an exemplary embodiment.
Figure 3:
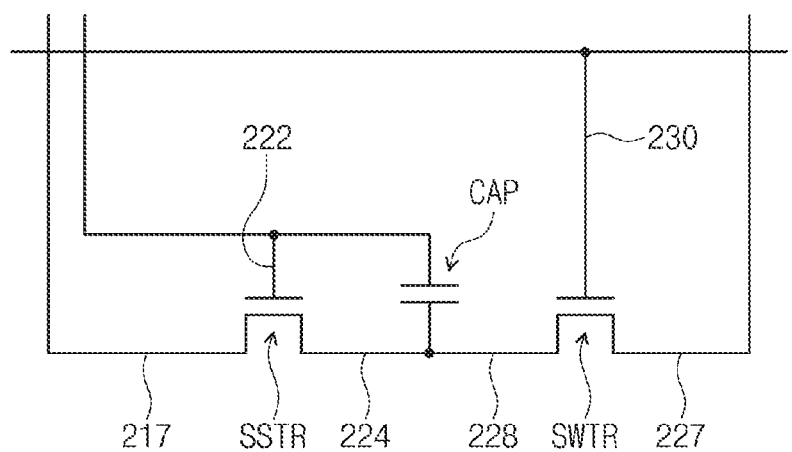
FIG. 3 schematically illustrates a circuit configuration of a sensing panel according to an exemplary embodiment.

FIG. 2 illustrates a portion of a cross section of the display device according to an exemplary embodiment, and FIG. 3 is a schematic illustration of a circuit configuration of a sensing panel according to an exemplary embodiment.

The display panel DPA may be divided into a light-emitting region LU and a non-light-emitting region NLU along a second direction DR2 perpendicular to a first direction DR1. The first direction DR1 may be the same direction as the thickness direction described in FIG. 1. Hereinafter, the thickness direction will be indicated and described as the first direction DR1.

The display panel DPA may include a substrate 200 and a buffer layer 201.

The substrate 200 may have a rectangular plate shape. However, exemplary embodiments are not limited thereto. The substrate 200 may be formed of a plastic material having excellent heat resistance and durability, such as polyimide (PI), polyethylene terephthalate (PET), polyethylene naphthalate (PEN), polycarbonate (PC), polyarylate (PAR), polyetherimide (PEI), polyethersulphone (PES), and fiber reinforced plastics.

The buffer layer 201 configured to provide smoothness and block the penetration of impurities may be disposed on a top surface of the substrate 200. The buffer layer 201 may be formed of an inorganic material, such as silicon oxide, silicon nitride, silicon oxynitride, aluminum oxide, aluminum nitride, titanium oxide, or titanium nitride, or an organic material, such as polyimide, polyester, and acryl, or a laminate of a plurality of materials selected from the materials listed above.

The display panel DPA may further include a thin film transistor TFT and a third insulation layer 204.

The thin film transistor TFT may include an active layer 205, a first insulation layer 202, and a second insulation layer 203.

The active layer 205 may be disposed in a predetermined region above the buffer layer 201. An inorganic semiconductor, such as silicon and an oxide semiconductor, or an organic semiconductor may be disposed on the buffer layer 201 on an entire surface of the substrate 200, and the active layer 205 may then be formed by patterning the inorganic semiconductor or the organic semiconductor using, for example, a photolithography process and an etching process.

The first insulation layer 202 may be disposed on the active layer 205. For example, the first insulation layer 202 may include an insulating material such as silicon oxide, silicon nitride, or silicon oxynitride, and may be formed by a method such as a plasma-enhanced chemical vapor deposition (PECVD) method, an atmospheric pressure chemical vapor deposition (APCVD) method, and a low pressure chemical vapor deposition (LPCVD) method.

The first insulation layer 202 may act as a gate insulation layer of the thin film transistor TFT by being disposed between the active layer 205 and a gate electrode 208 of the thin film transistor TFT. The first insulation layer 202 may have a structure in which silicon oxide and silicon nitride are stacked.

The gate electrode 208 of the thin film transistor TFT may be disposed in a predetermined region above the first insulation layer 202. The gate electrode 208 of the thin film transistor TFT may be connected to a gate line (not shown) to which a control signal for controlling the thin film transistor TFT is applied. The thin film transistor TFT may be electrically conductive according to the signal applied to the gate electrode 208 of the thin film transistor TFT through the gate line.

The second insulation layer 203 may be disposed above the gate electrode 208 of the thin film transistor TFT. The second insulation layer 203 may include silicon oxide and silicon nitride.

A contact hole, which defines a source region and a drain region of the active layer 205, may be formed on the first insulation layer 202 and the second insulation layer 203. Each of a source electrode 207 of the thin film transistor TFT and a drain electrode 209 of the thin film transistor TFT may be electrically connected by the contact hole and the active layer 205.

In consideration of conductivity, the source electrode 207 of the thin film transistor TFT and the drain electrode 209 of the thin film transistor TFT, for example, may be formed as a single layer or multilayer of at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The third insulation layer 204 may be disposed to cover the thin film transistor TFT from the top. The third insulation layer 204 may include an inorganic insulation layer or an organic insulation layer and may protect the thin film transistor TFT.

The third insulation layer 204 may have a composite laminated structure of an inorganic insulation layer and an organic insulation layer. In this case, when a pixel PX is disposed above the thin film transistor TFT as illustrated in FIG. 2, the organic insulation layer may act as a planarization layer for the planarization of a top surface of the inorganic insulation layer that covers the thin film transistor TFT.

The display panel DPA may further include the pixel PX and a pixel-defining layer 213.

The pixel PX may include a pixel electrode 211, an emission layer 212, and a counter electrode 214.

The third insulation layer 204 may include a contact hole which exposes at least one of the source electrode 207 of the thin film transistor TFT and the drain electrode 209 of the thin film transistor TFT, and the pixel electrode 211 may be electrically connected to the thin film transistor TFT by being connected to any one of the source electrode 207 of the thin film transistor TFT and the drain electrode 209 of the thin film transistor TFT through the contact hole.

The pixel PX may be categorized into a bottom emission type, a top emission type, and a dual emission type.

In the bottom emission type pixel, the pixel electrode 211 may be a light-transmitting electrode, and the counter electrode 214 may be a reflective electrode. In the top emission type pixel, the pixel electrode 211 may be a reflective electrode, and the counter electrode 214 may be a transflective electrode. In an exemplary embodiment, the pixel PX will be described based on the top emission type in which the pixel PX emits light in the first direction DR1, but exemplary embodiments are not limited thereto.

The pixel electrode 211 may be a reflective electrode. The pixel electrode 211 may include a laminated structure of a reflective layer and a transparent electrode layer having high work function. The pixel electrode 211 may have a single layer or multilayer structure and may be variously modified. The pixel electrode 211 may act as an anode.

The pixel-defining layer 213, which covers edges of the pixel electrode 211 and includes a predetermined opening configured to expose the center of the pixel electrode 211, may be disposed on the pixel electrode 211. The pixel-defining layer 213, for example, may be formed of an organic material such as polyimide.

The emission layer 212 may be disposed on the pixel electrode 211. A region, in which the emission layer 212 is disposed, may be defined as the light-emitting region LU. Multiple light-emitting regions LU may be provided in the display panel. According to an exemplary embodiment, the light-emitting region LU may overlap the emission layer 212 in the first direction DR1.

The emission layer 212 may include an organic light-emitting layer (not shown) that emits light. A low-molecular organic material or high-molecular organic material may be used as the emission layer 212. In a case in which the organic light-emitting layer is a low-molecular organic layer formed of the low-molecular organic material, a hole transport layer (HTL) and a hole injection layer (HIL) may be disposed in a direction of the pixel electrode 211 and an electron transport layer (ETL) and an electron injection layer (EIL) may be disposed in a direction of the counter electrode 214 about the organic light-emitting layer. Of course, other functional layers, in addition to the hole injection layer, hole transport layer, electron transport layer, and electron injection layer, may be stacked.

The counter electrode 214 may be provided as a transmissive electrode. The counter electrode 214 may be a transflective layer in which metal having low work function, such as Li, Ca, LiF/Ca, LiF/Al, Al, Mg, and Ag formed in a thin manner. The counter electrode 214 may act as a cathode.

Polarities of the pixel electrode 211 and the counter electrode 214 may be opposite to each other.

Since the organic light-emitting layer is not formed in regions configured overlapping the pixel-defining layer 213 in the first direction DR1, the regions may be defined as the non-light-emitting regions NLU. According to an exemplary embodiment, the non-light-emitting region NLU may overlap the pixel-defining layer 213 in the first direction DR1.

An encapsulation layer 215 may be disposed on the counter electrode 214.

The encapsulation layer 215 may be disposed to seal the first to third insulation layers 202, 203, and 204, the thin film transistor TFT, the pixel PX, and the pixel-defining layer 213.

The encapsulation layer 215 may function to protect the pixel PX which may be easily deteriorated by external moisture or oxygen. The encapsulation layer 215 may include an organic material, and, furthermore, the encapsulation layer 215 may have a structure in which an organic layer and an inorganic layer are stacked.

The buffer member CM may be disposed by being attached to a top surface of the encapsulation layer 215. The buffer member CM may include a polymer or an organic material. The buffer member CM may absorb an external impact. The buffer member CM may function to prevent the external impact from being transferred to the display panel DPA or the sensing panel SPA.

The sensing panel SPA may be disposed on a top surface of the buffer member CM.

Referring to FIGS. 1 and 2, the sensing panel SPA may include a sensing transistor SSTR, a switching transistor SWTR, a cover window 220, a fourth insulation layer 218, and a fifth insulation layer 219.

The non-light-emitting region NLU may include a sensing area SEA and a switching area SWA.

Overall, as illustrated in FIG. 2, the areas may be sequentially divided into the switching area SWA, the light-emitting region LU, and the sensing area SEA based on the second direction DR2.

The sensing transistor SSTR may overlap the sensing area SEA in the first direction DR1 and may be spaced apart from the light-emitting region LU in the second direction DR2. Specifically, the sensing transistor SSTR may not overlap the non-light-emitting region NLU in the first direction DR1.

A source electrode 224 and a drain electrode 217 of the sensing transistor SSTR may be disposed on the buffer member CM.

Each of the source electrode 224 and the drain electrode 217 of the sensing transistor SSTR may be insulated from a gate electrode 222 of the sensing transistor SSTR by the fourth insulation layer 218. The fourth insulation layer 218 may include an insulating material such as silicon oxide, silicon nitride, or silicon oxynitride.

The sensing transistor SSTR may include a photosensitive layer 223. The photosensitive layer 223 may be disposed above the gate electrode 222 of the sensing transistor SSTR. The photosensitive layer 223 may connect the source electrode 224 and the drain electrode 217 of the sensing transistor SSTR.

The photosensitive layer 223 may include an oxide semiconductor. For example, the photosensitive layer 223 may include amorphous silicon (a-Si:H).

The photosensitive layer 223 may be insulated from the gate electrode of the sensing transistor SSTR by the fifth insulation layer 219. The fifth insulation layer 219 may be disposed above the fourth insulation layer 218 and may include an insulating material such as silicon oxide, silicon nitride, or silicon oxynitride.

The photosensitive layer 223 may sense light and may generate a current by sensing the amount of external light. Specifically, when the photosensitive layer 223 senses a predetermined amount of light, the source electrode 224 and the drain electrode 217 of the sensing transistor SSTR may be electrically conductive. In an embodiment of the inventive concept, the photosensitive layer may generate the current by sensing light which is emitted from the pixel and reflected by an external object (e.g., fingerprint of a person).

The switching transistor SWTR may overlap the switching area SWA in the first direction DR1 and may be spaced apart from the light-emitting region LU in the second direction DR2. Specifically, the switching transistor SWTR may not overlap the non-light-emitting region NLU in the first direction DR1.

A source electrode 227 and a drain electrode 228 of the switching transistor SWTR may be disposed on a top surface of the buffer member CM.

Each of the source electrode 227 and the drain electrode 228 of the switching transistor SWTR may be insulated from a gate electrode 230 of the switching transistor SWTR by the fourth insulation layer 218.

The switching transistor SWTR may include a semiconductor layer 229. The semiconductor layer 229 may be disposed above the gate electrode 230 of the switching transistor SWTR, and the semiconductor layer 229 may connect the source electrode 227 and the drain electrode 228 of the switching transistor SWTR.

The sensing panel SPA may further include a first electrode 225 and a second electrode 226.

The first electrode 225 may be a transparent electrode. The first electrode 225 may be disposed on the buffer member CM. The source electrode 224 of the sensing transistor SSTR and the drain electrode 228 of the switching transistor SWTR may be electrically connected by the first electrode 225. The first electrode 225 may be formed by depositing a transparent conductive material, such as indium tin oxide (ITO), and then patterning the transparent conductive material.

The second electrode 226 may be a transparent electrode. The second electrode 226 may be disposed on the fourth insulation layer 218, and the first electrode 225 and the second electrode 226 may be insulated by the fourth insulation layer 218. The second electrode 226 may be connected to the gate electrode 222 of the sensing transistor SSTR.

The cover window 220 may be disposed on a top side of the sensing panel SPA. The cover window 220 may include a transparent material. For example, the cover window 220 may include transparent polyimide (PI).

The light emitted from the pixel PX may finally be emitted to the outside through the cover window 220.

The light emitted to the outside through the cover window 220 may be reflected to the cover window 220 by the external object. Specifically, the light is reflected to the cover window 220 according to a pattern of the fingerprint, and, as described above, since the light is received by the photosensitive layer 223, the sensing transistor SSTR may generate a current.

Referring to FIGS. 2 and 3, the generated current may be stored in the form of a charge in a capacitor CAP. The capacitor CAP may include the first electrode 225, the fourth insulation layer 218, and the second electrode 226. One end of the capacitor CAP may be connected to the gate electrode 222 of the sensing transistor SSTR, and the other end of the capacitor CAP may be connected to the source electrode 224 of the sensing transistor SSTR and the drain electrode 228 of the switching transistor SWTR.

The switching transistor SWTR may output charge information stored in the capacitor CAP. Specifically, since the switching transistor SWTR may be switched for each frame by a gate control signal (not shown) applied to the gate electrode 230 of the switching transistor SWTR, the stored charge information including the pattern of the fingerprint may be output for each frame.

Figure 4:
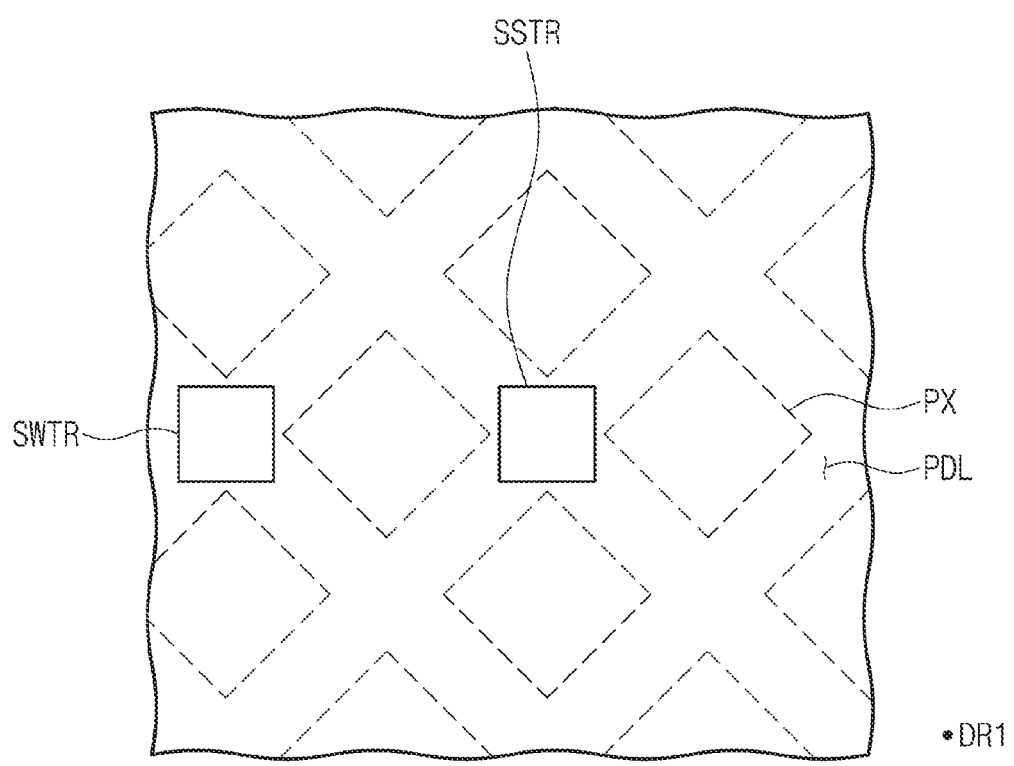
FIG. 4 illustrates a portion of a plane of the sensing panel according to an exemplary embodiment.

FIG. 4 illustrates a portion of a plane of the sensing panel according to an exemplary embodiment.

Referring to FIG. 4, the sensing transistor SSTR and the switching transistor SWTR may be disposed on the pixel-defining layer 213. Specifically, each of the sensing transistor SSTR and the switching transistor SWTR may be disposed on the pixel-defining layer 213 by overlapping the pixel-defining layer 213 in the first direction DR1.

That is, each of the sensing transistor SSTR and the switching transistor SWTR does not overlap the pixel PX in the first direction DR1.

Consequently, since each of the sensing transistor SSTR and the switching transistor SWTR may be disposed to overlap the pixel-defining layer 213 in the first direction DR1 and not to overlap the pixel PX in the first direction DR1, the light emitted from the pixel PX may be emitted to the outside without interference and a sufficient opening for emitting the light may be provided.

Figure 5:
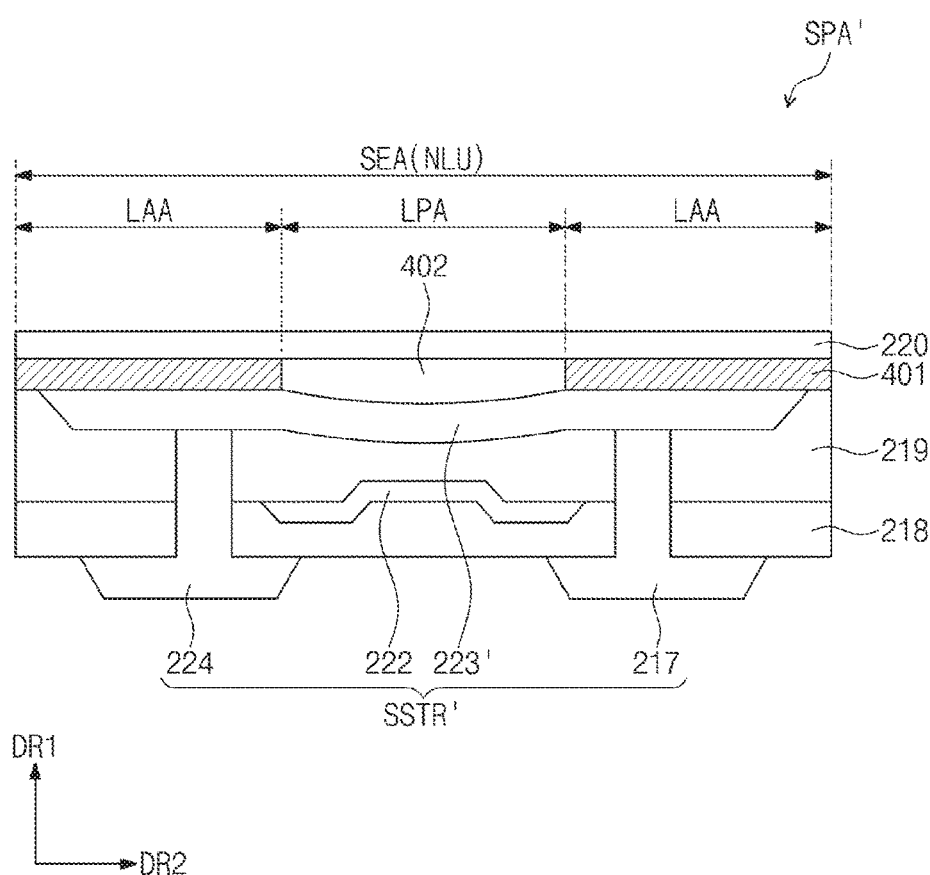
FIG. 5 illustrates a portion of a cross section of a sensing panel corresponding to a sensing area according to another exemplary embodiment.

FIG. 5 illustrates a portion of a cross section of a sensing panel corresponding to a sensing area according to another exemplary embodiment.

A sensing panel SPA' illustrated in FIG. 5 may further include a lens layer 402 and a light-absorbing member 401 in comparison to the sensing panel SPA illustrated in FIG. 2.

In an exemplary embodiment, a portion of the cover window 220 overlapping the sensing area SEA in the first direction DR1 may be divided into a light-transmitting area LPA and a light-absorbing area LAA. The light-transmitting area LPA may be spaced apart from the light-absorbing area LAA in the second direction DR2.

The light-absorbing member 401 may be disposed under the cover window 220. Specifically, the light-absorbing member 401 may be disposed on a bottom surface of the light-absorbing area LAA and may be spaced apart from the light-transmitting area LPA in the second direction DR2. That is, the light-absorbing member 401 may not overlap the light-transmitting area LPA in the first direction DR1.

The light-absorbing member 401 may include a colored dielectric. For example, the light-absorbing member 401 may include a black dielectric.

Since the light-absorbing member 401 is disposed on the bottom surface of the light-absorbing area LAA, transmission or reflection of light at the light-absorbing area LAA may be prevented and interference of the light in the light-transmitting area LPA may be reduced by absorbing the light. Thus, resolution of an output image may be increased.

The lens layer 402 may be disposed under the cover window 220. Specifically, the lens layer 402 may be disposed under the light-transmitting area LPA and may be disposed to be spaced apart from the light-absorbing area LAA in the second direction DR2.

The lens layer 402 may be disposed between the cover window 220 and a sensing transistor SSTR'. The lens layer 402 may be a lens which is convex toward the sensing transistor SSTR', that is, a direction opposite to the first direction DR1. For example, a bottom surface of the lens layer 402 may have a shape which is convex toward the sensing transistor SSTR'.

A photosensitive layer 223' may be disposed under the lens layer 402 and the light-absorbing member 401 corresponding to the shape of the lens layer 402. For example, a portion of the photosensitive layer 223' corresponding to the light-transmitting area LPA may also have a shape which is convex in the direction opposite to the first direction DR1.

The photosensitive layer 223' may overlap the light-transmitting area LPA in the first direction DR1 and may be disposed to be spaced apart from the light-absorbing area LAA in the second direction DR2. That is, the photosensitive layer 223' may not overlap the light-absorbing area LAA in the first direction DR1.

Since the lens layer 402 is disposed as illustrated in FIG. 5, the lens layer 402 may collect light transmitting through the light-transmitting area LPA, and thus, optical loss may be minimized and sensing sensitivity of the photosensitive layer 223' may be improved.

Figure 6A:
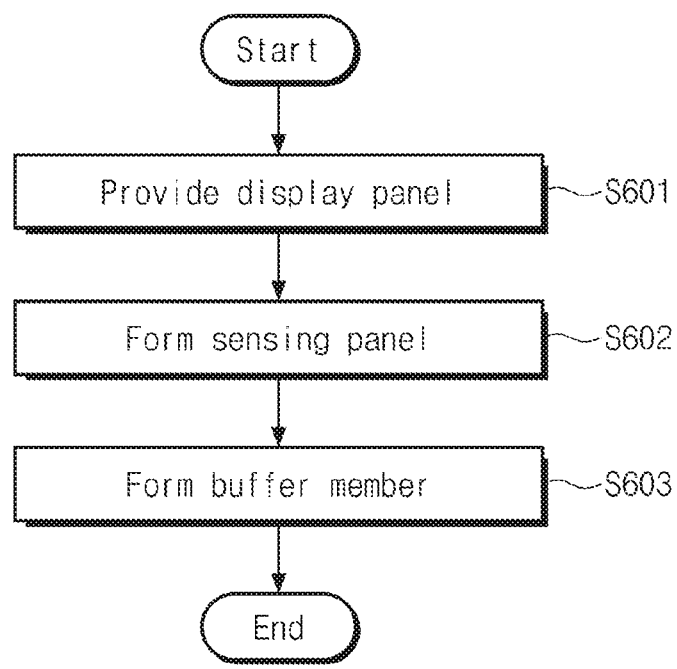
FIG. 6A and FIG. 6B are flowcharts of a method of fabricating a display device according to an exemplary embodiment.
Figure 6B:
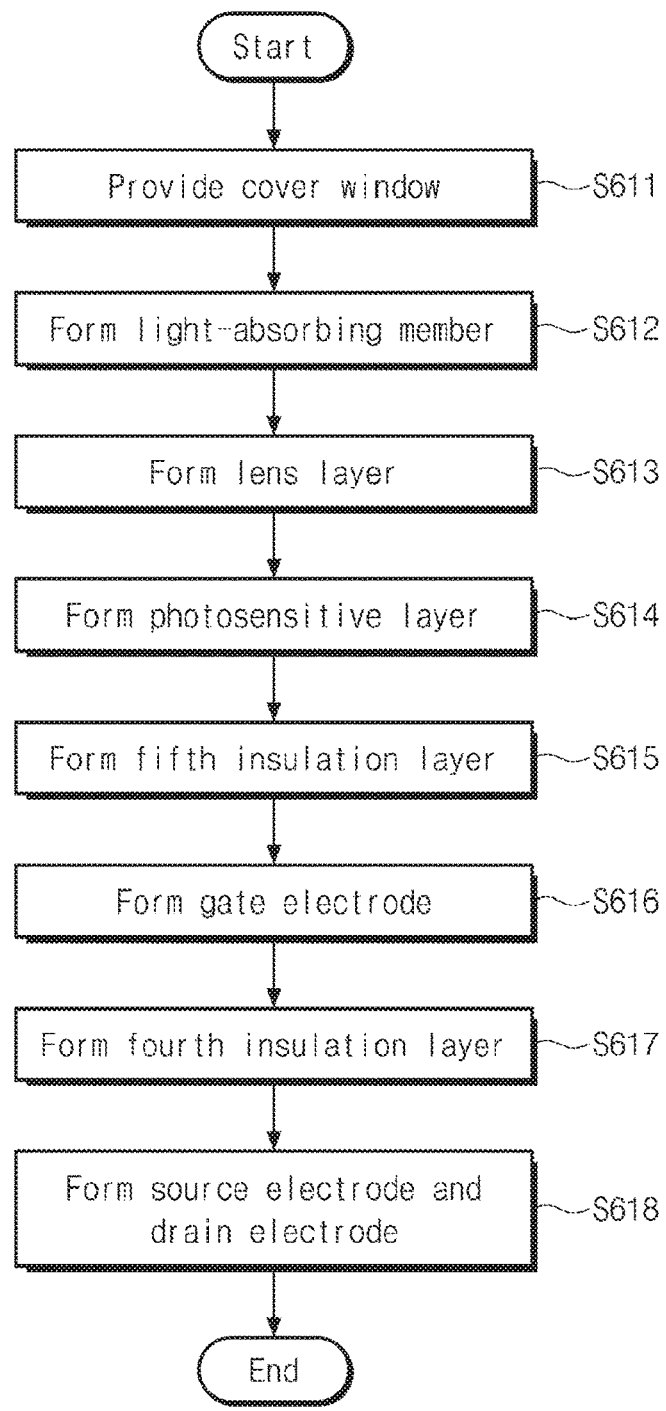
Figure 7A:
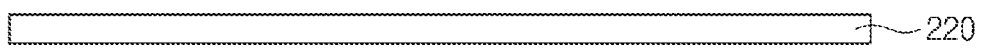
FIG. 7A, FIG. 7B, FIG. 7C, FIG. 7D, FIG. 7E, FIG. 7F, FIG. 7G, FIG. 7H, and FIG. 7I are drawings for illustrating the flowcharts of FIGS. 6A and 6B.
Figure 7B:
Figure 7C:
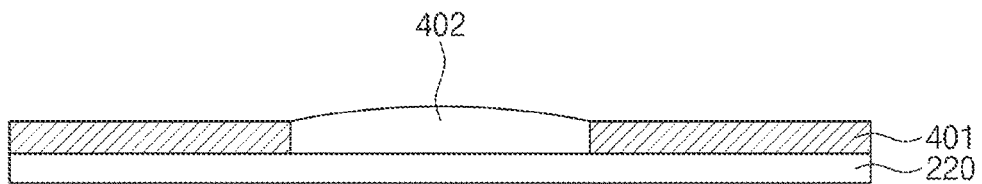
Figure 7D:
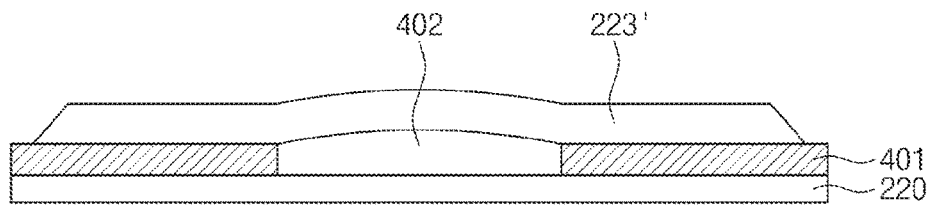
Figure 7E:
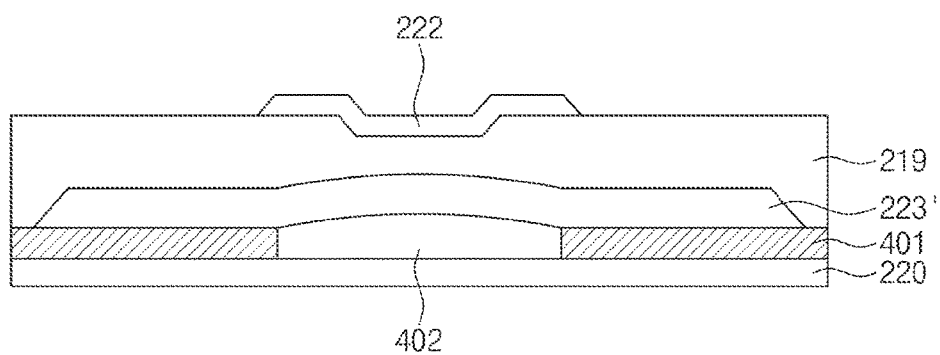
Figure 7F:
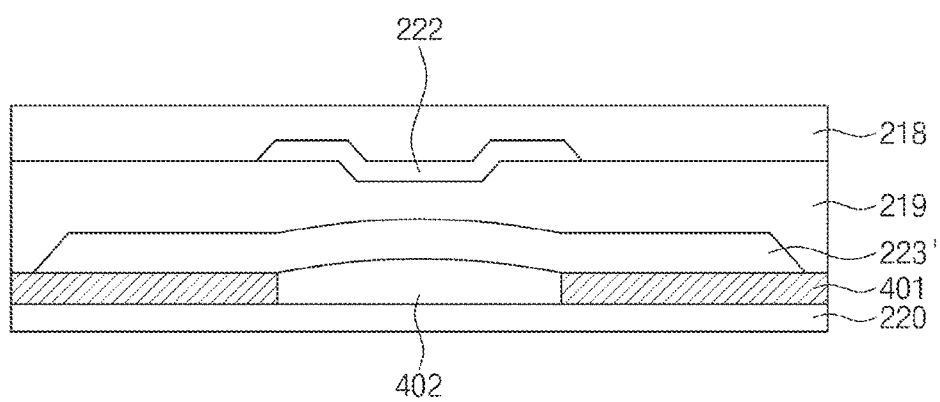
Figure 7G:
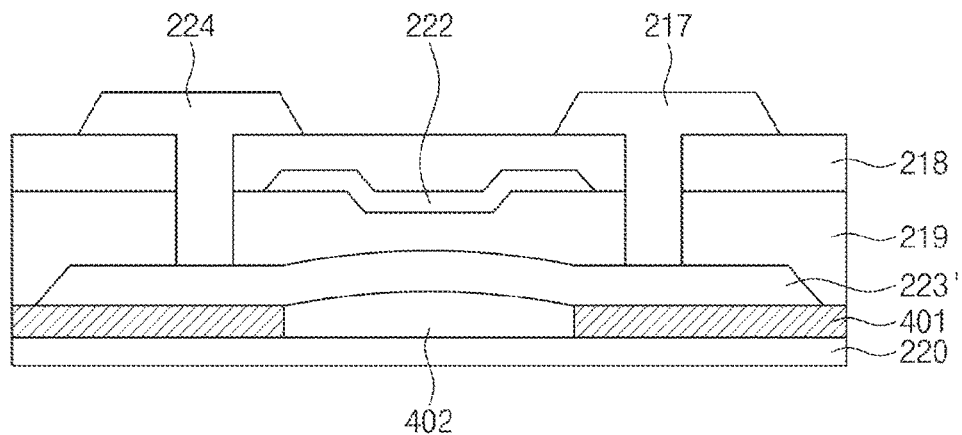
Figure 7H:
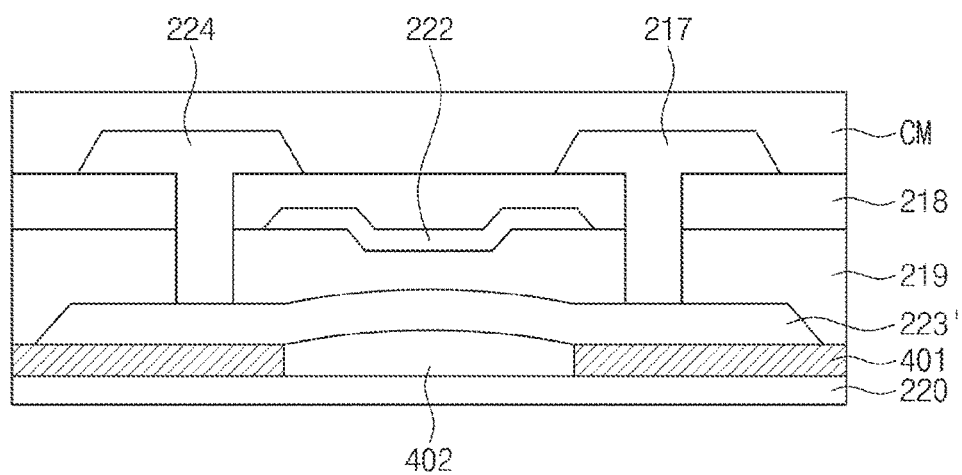
Figure 7I:
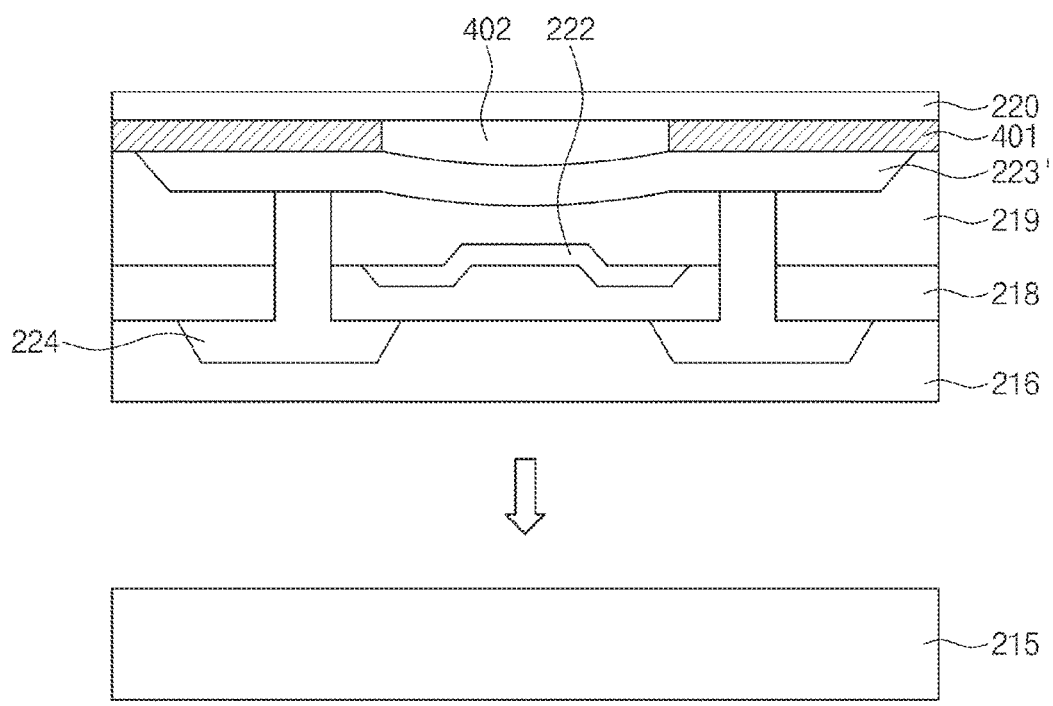

FIGS. 6A and 6B are flowcharts of a method of fabricating a display device according to an exemplary embodiment, and FIGS. 7A through 7I are drawings for illustrating the flowcharts of FIGS. 6A and 6B.

Hereinafter, FIGS. 6A, 6B, and 7A to 7I will be described, except for the descriptions overlapping with those described above.

Referring to FIGS. 5, 6A, 6B, and 7A to 7I, the method of fabricating a display device according to an exemplary embodiment may first include providing a display panel PDA (S601).

Next, a sensing panel SPA' may be formed (S602).

Specifically, the cover window 220 may first be provided (S611). The light-absorbing member 401 may be formed on the cover window 220 (S612). Specifically, the light-absorbing member 401 may be formed by patterning a material including the dielectric on the light-absorbing area LAA.

Next, the lens layer 402 may be formed (S613). Specifically, the lens layer 402 having a shape, which is convex upward, may be formed on the light-transmitting area LPA.

The lens layer 402 may be formed by a photolithography process using a half-tone mask or an imprint process.

Next, the photosensitive layer 223' may be formed on the lens layer 402 (S614). The photosensitive layer 223' may be formed on the lens layer 402 corresponding to the shape of the lens layer 402.

Next, the fifth insulation layer 219 may be formed (S615).

The fifth insulation layer 219 may be formed to cover the photosensitive layer 223'.

Next, the gate electrode 222 of the sensing transistor SSTR may be formed on the fifth insulation layer 219 (S616). The fourth insulation layer 218 may be formed to cover the gate electrode 222 of the sensing transistor SSTR (S617). The sensing panel SPA' may be formed by forming the source electrode 224 and the drain electrode 217 of the sensing transistor SSTR through a photolithography process.

When the sensing panel SPA' is formed, a buffer member CM may be formed (S603).

Specifically, the buffer member CM may be formed to allow one surface of the buffer member CM to be attached to one surface of the sensing panel SPA' and the other surface of the buffer member CM to be attached to the top surface of the display panel DPA. For example, the one surface may cover the source electrode 224 and the drain electrode 217 of the sensing transistor SSTR, and the other surface may be attached to the top surface of the encapsulation layer 215 illustrated in FIG. 2.

That is, the sensing panel SPA' may be disposed on the display panel DPA to allow the sensing transistor SSTR to face the top of the display panel DPA.

Since the sensing panel SPA' is individually prepared by the above-described process and then combined with the display panel DPA through the buffer member CM, the process may be subdivided. Thus, process efficiency in the fabrication of the display device may be improved.

In accordance with the inventive concepts, since a sensing transistor configured to sense external light is disposed to overlap a pixel-defining layer in a vertical direction and not to overlap an emission layer in the vertical direction, light emitted from the emission layer may be emitted to the outside without interference and a sufficient opening for the emission of the light may be provided. Reflected light, such as from a fingerprint or vein, is received by the sensing transistor to generate current to act as a biometric sensor.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
    a display panel comprising a substrate, which is divided into a light-emitting region and a non-light-emitting region including a sensing area, a thin film transistor, a pixel comprising a pixel electrode disposed on the light-emitting region and electrically connected to the thin film transistor, and a pixel-defining layer disposed on the non-light-emitting region and covering edges of the pixel electrode to expose a center of the pixel electrode; and
    a sensing panel which is disposed on the display panel and comprises a sensing transistor configured to sense light that is emitted from the pixel and reflected by an external object,
    wherein the sensing transistor overlaps the pixel-defining layer in the sensing area of the non-light-emitting region in a first direction parallel to a thickness direction of the display panel, does not overlap the light-emitting region in the first direction, is spaced apart from the light-emitting region in a second direction perpendicular to the first direction, and generates a current by receiving the light.

2. The display device of claim 1, wherein the sensing panel further comprises a cover window and a lens layer,
    the sensing transistor comprises a photosensitive layer configured to sense the light,
    the cover window is divided into a light-transmitting area, which overlaps the photosensitive layer in the first direction and is disposed on the sensing area, and a light-absorbing area which is spaced apart from each of the photosensitive layer and the light-transmitting area in the second direction and disposed on the sensing area, and
    the lens layer overlaps the light-transmitting area in the first direction.

3. The display device of claim 2, wherein the lens layer is spaced apart from the light-absorbing area in the second direction and is disposed between the cover window and the sensing transistor,
    wherein a bottom surface of the lens layer has a shape which is convex toward the sensing transistor.

4. The display device of claim 3, wherein the sensing panel further comprises a light-absorbing member disposed on a bottom surface of the light-absorbing area.

5. The display device of claim 4, wherein the light-absorbing member is spaced apart from the light-transmitting area in the second direction.

6. The display device of claim 1, wherein the non-light-emitting region further comprises a switching area, and
the sensing panel further comprises a switching transistor which overlaps the switching area in the first direction and is spaced apart from each of the light-emitting region and the sensing area in the second direction.

7. The display device of claim 6, wherein the sensing panel further comprises a transparent electrode which electrically connects a source electrode of the sensing transistor and a drain electrode of the switching transistor and overlaps the light-emitting region in the first direction.

8. The display device of claim 7, wherein the sensing panel further comprises a sensing processing unit, and
the switching transistor outputs a current generated from the sensing transistor to the sensing processing unit by switching.

9. A method of fabricating a display device, the method comprising:
providing a display panel comprising a substrate which is divided into a light-emitting region and a non-light-emitting region including a sensing area, a thin film transistor, a pixel comprising a pixel electrode disposed on the light-emitting region and electrically connected to the thin film transistor, and a pixel-defining layer disposed on the non-light emitting region and covering edges of the pixel electrode to expose a center of the pixel electrode;
forming a sensing panel; and
disposing the sensing panel on the display panel,
wherein the forming of the sensing panel comprises:
forming a cover window; and
forming a sensing transistor on the cover window to overlap the pixel-defining layer in the sensing area in a first direction parallel to a thickness direction of the display panel, to not overlap the light-emitting region in the first direction, and to be spaced apart from the light-emitting region in a second direction perpendicular to the first direction, and
the disposing of the sensing panel comprises disposing the sensing panel on the display panel to allow the sensing transistor to face a top of the display panel.

10. The method of claim 9, wherein
the sensing transistor comprises a photosensitive layer configured to sense light which is emitted from the pixel and reflected by an external object,
the cover window is divided into a light-transmitting area, which overlaps the photosensitive layer in the first direction and is disposed on the sensing area, and a light-absorbing area which is spaced apart from each of the photosensitive layer and the light-transmitting area in the second direction and disposed on the sensing area, and
the forming of the sensing panel further comprises forming a lens layer to overlap the light-transmitting area in the first direction.

11. The method of claim 10, wherein the forming of the lens layer comprises forming the lens layer to be spaced apart from the light-absorbing area in the second direction.

12. The method of claim 10, wherein the forming of the lens layer comprises forming the lens layer to be disposed between the cover window and the sensing transistor and to allow a bottom surface thereof to be convex toward the sensing transistor.

13. The method of claim 10, wherein the forming of the sensing panel further comprises forming a light-absorbing member on a bottom surface of the light-absorbing area.

14. The method of claim 13, wherein the forming of the light-absorbing member comprises forming the light-absorbing member to be spaced apart from the light-transmitting area in the second direction.

15. The method of claim 9, further comprising forming a buffer member to allow one surface thereof to be attached to the sensing panel and another surface thereof to be attached to the display panel.

* * * * *